United States Patent [19]

Oritani

[11] 4,455,627

[45] Jun. 19, 1984

[54] STATIC TYPE SEMICONDUCTOR MEMORY DEVICE

[75] Inventor: Atsushi Oritani, Yokohama, Japan

[73] Assignee: Fujitsu Limited, Kawasaki, Japan

[21] Appl. No.: 346,199

[22] Filed: Feb. 5, 1982

[30] Foreign Application Priority Data

Feb. 6, 1981 [JP] Japan .................................. 56-16488

[51] Int. Cl.$^3$ ............................................ G11C 13/00
[52] U.S. Cl. ..................................... 365/226; 365/227
[58] Field of Search ................ 365/226, 227, 228, 189

[56] References Cited

U.S. PATENT DOCUMENTS 4,400,802 8/1983 Rydval ................................ 365/226

Primary Examiner—Terrell W. Fears

Attorney, Agent, or Firm—Staas & Halsey

[57] ABSTRACT

A static type semiconductor memory device has a power down mode in which an operating voltage for peripheral circuits, such as decoder circuits, is turned off when the memory chip is in a non-selected condition. The static type semiconductor memory device comprises first transistors, which are connected to a pair of data buses and which pull down the potentials of the pair of data buses to a medium potential when the memory chip has changed from a selected condition, to the non-selected condition and second transistors which are connected to the pair of data buses and which pull up the potentials of the pair of data buses to a high potential when the memory chip has changed from a non-selected condition to a selected condition.

11 Claims, 5 Drawing Figures

STATIC TYPE SEMICONDUCTOR MEMORY DEVICE

BACKGROUND OF THE INVENTION

(1) Field of the Invention

The present invention relates to a static type semiconductor memory device and more particularly to a semiconductor memory device which is used, for example, in an electronic computer and which is operated in a power down mode when the chip of the semiconductor memory device is not selected.

(2) Description of the Prior Art

The static type semiconductor RAM device of recent years has mostly been a gated static type RAM device having a power down mode. In order to decrease power consumption, such a gated static type RAM device is operated in the power down mode when the memory chip of the gated static RAM device is not selected, i.e., when the memory chip is on standby. When the memory chip is selected, the RAM device is operated in a usual operating mode in which power consumption is larger than that in the power down mode. The memory chip is selected when a chip select signal $\overline{CS}$ applied thereto is low and is not selected when the chip select signal $\overline{CS}$ is high. In the RAM device, power is saved, for example, by turning off the power source supplied to peripheral circuits thereof, such as decoder circuits, by using output signals from buffer amplifiers which receive the chip select signal $\overline{CS}$. In this case, only the power source supplied to memory cells is kept in a turned on condition. When the power source to the decoder circuits is turned off, all the memory cells are disconnected from bit line pairs and all the bit line pairs are disconnected from a data bus pair. The bit line pairs and the data bus pair are then pulled up to a high potential level by respective pull up circuits. However, the size of the transistors used in the pull up circuits has become smaller due to the recent increase in the degree of integration of the RAM device, and the gm of each of the transistors of the pull up circuits has become small, so that the pull up speeds of the bit line pairs and the data bus pair have been reduced. The potential of a bit line of a selected bit line pair is low and the potential of the other bit line of the selected bit line pair is high, so that the potential of a data bus of the data bus pair which receives the potentials of the selected bit line pair is low and the potential of the other data bus of the data bus pair is high. Therefore, it is difficult to rapidly pull up the potentials of the bit line pair and data bus pair to the same high potential level after the power source of the decoder circuits is turned off in the power down mode, and the potentials of the bit lines of the selected pair or the potentials of the data buses are different from each other at the beginning of the power down mode.

Therefore, in a conventional static type semiconductor RAM device, when the memory chip thereof is reactivated a short time after the memory chip is at standby, i.e., in the power down mode, the readout speed of the RAM device becomes low because of the above-mentioned difference in potential of the data bus lines. When the condition of the memory chip has changed from a non-selected condition to a selected condition and readout is effected, the readout speed is also decreased as a result of the delay in activation of the peripheral circuits after the operating voltage is supplied thereto due to the change of the chip select signal $\overline{CS}$ from high to low. Therefore, the access time of the conventional RAM device, when the condition of the memory chip has changed from the non-selected condition to the selected condition, is too long.

SUMMARY OF THE INVENTION

It is the principal object of the present invention to shorten the access time of a static type semiconductor RAM device, having a power down mode, when the memory chip thereof has changed from a non-selected condition to a selected condition.

It is another object of the present invention to shorten the access time of a static type semiconductor RAM device without increasing very much the power consumption thereof.

According to the present invention, there is provided a static type semiconductor memory device comprising a plurality of static type memory cells, each of which is connected to a pair of bit lines connected to a pair of data buses through a pair of column selecting transistors. The semiconductor memory device further comprises first transistors which are connected to the pair of data buses and which are turned on for a short time when the chip of the semiconductor memory device is changed from a selected condition to a non-selected condition, and second transistors. The first transistors pull down the potentials of the pair of data buses toward a relatively low potential. The second transistors are also connected to the pair of data buses and are turned on for a short time when the chip of the semiconductor memory device is changed from the non-selected condition to the selected condition. The second transistors pull up the potentials of the pair of data buses toward a relatively high potential. The static type semiconductor memory device is operated in a power down mode in which all of the plurality of static type memory cells are electrically disconnected from the pairs of bit lines when the chip of the semiconductor memory device is in the non-selected condition.

DESCRIPTION OF THE PREFERRED EMBODIMENT

With reference to the attached drawings, an embodiment of the present invention will now be explained.

Figure 1:
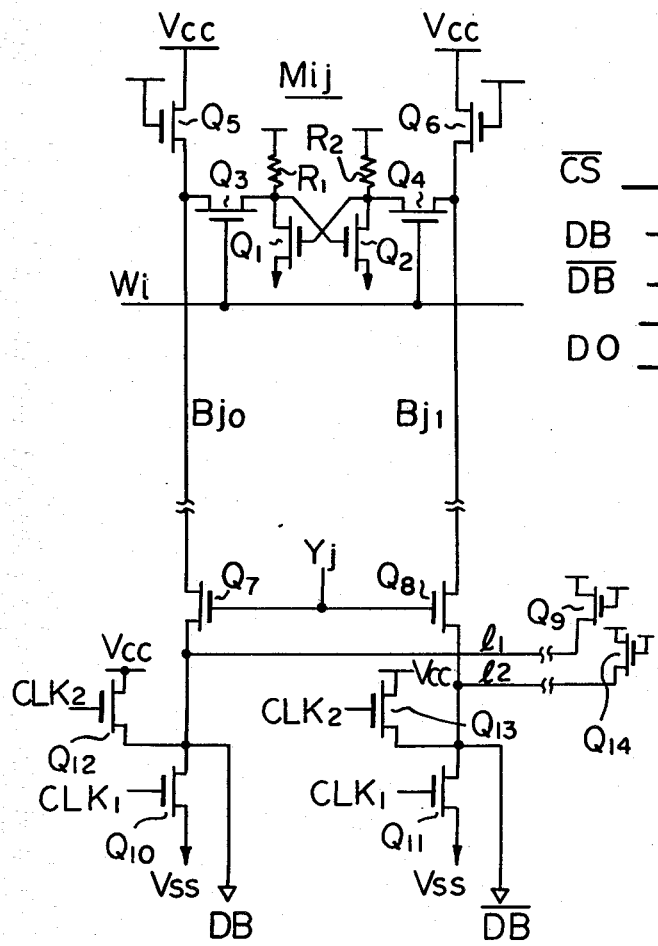
FIG. 1 is partial circuit diagram of an embodiment of a static type semiconductor RAM device in accordance with the present invention.

FIG. 1 is a circuit diagram of a part of a MOS static RAM device according to the present invention. In FIG. 1, Wi designates a word line, Bj0 and Bj1 designate a bit line pair, and Mij designates a flip-flop type memory cell disposed on an intersecting portion of the word line Wi and the bit line pair Bj0 and Bj1. The memory cell Mij comprises a flip-flop formed of MOS transistors Q1 and Q2 and load resistors R1 and R2, and transfer gates formed of MOS transistors Q3 and Q4. Q5 and Q6 are load transistors which pull up the bit line pair Bj0 and Bj1 to an operating voltage Vcc. Q7 and Q8 are column selecting transistors which connect the bit line pair Bj0 and Bj1 to the data bus pair DB and $\overline{DB}$ under the control of a column selecting voltage Yj applied to the gate electrodes of the transistors Q7 and Q8. In FIG. 1, only one memory cell Mij disposed in row i and column j is shown. However, a practical memory device comprises a number of memory cells each having the same structure as that of the memory cell Mij of FIG. 1 and a number of bit line pairs connected to the data bus pair DB and $\overline{DB}$ through respective column selecting transistors. The connecting lines $l_1$ and $l_2$ of FIG. 1 schematically show the connection of many bit lines to the data bus pair DB and $\overline{DB}$. Q9 and Q14 of FIG. 1 designate load transistors for the data buses DB and $\overline{DB}$, respectively. Q10 and Q11 are first transistors connected between the data buses DB and $\overline{DB}$ and a low potential voltage Vss, for example, ground, and are controlled by a first clock signal CLK1. Q12 and Q13 are second transistors connected between the data buses DB and $\overline{DB}$ and a high potential voltage Vcc and are controlled by a second clock signal CLK2.

Operation of the RAM device of FIG. 1 will now be described. When write-in of information is effected, the potential of one of the bit lines of the bit line pair Bj0 and Bj1, for example, Bj0, is caused to be high, the potential of the other bit line of the same bit line pair, for example, Bj1, is caused to be low by write-in signals supplied through the data bus pair DB and $\overline{DB}$, and the potential of the word line Wi is caused to be high, so that the transistors Q3 and Q4 are turned on. In this condition, one of the transistors of the memory cell Mij, i.e., Q2, is turned on and another one of the transistors of the same memory cell Mij, i.e., Q1, is turned off, so that the write-in of information is effected. When readout of information from the memory cell Mij is effected, the potential of the word line Wi is caused to be high, and the transistors Q3 and Q4 are turned on. In this condition, the potential of one of the bit lines becomes high and the potential of the other bit line becomes low according to the internal condition of the memory cell Mij. If the transistor Q2 is in a turned on condition and the transistor Q1 is in a turned off condition, as a result of the above-mentioned write-in operation, the bit line Bj0 becomes high and the bit line Bj1 becomes low. These potentials of the bit lines Bj0 and Bj1 are transferred to the data bus pair DB and $\overline{DB}$ through the transistors Q7 and Q8, which are turned on by the column selecting potential Yj, and the difference between these potentials is detected by a sense amplifier (not shown in FIG. 1).

Figure 2:
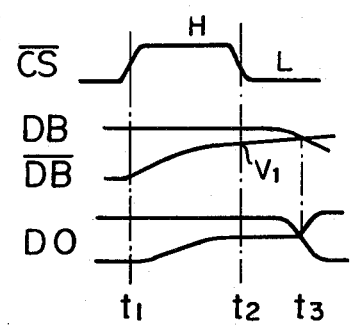
FIG. 2 is a waveform diagram which illustrates the operation of a conventional static type semiconductor RAM device.

With reference to FIG. 2, the operation of a conventional static RAM device, having nearly the same structure as that of FIG. 1 except that the transistors Q10 through Q13 are not connected to the data bus pair DB and $\overline{DB}$, will now be described in order to compare it with the static RAM device according to the present invention. During an interval between times t1 and t2 when the chip select signal $\overline{CS}$ is high, the memory chip of such a conventional static RAM device is in a non-selected condition, i.e., in a power down mode, and the operating voltage supplied to word decoders is turned off. Therefore, the potentials of all the word lines become low and all the memory cells are disconnected from the bit line pairs. In this case, the power supply voltage to the memory cells is supplied even in the power down mode in order to hold the information stored in the memory cells. After all the memory cells are disconnected from the bit line pairs, all the bit line pairs are pulled up toward the operating voltage Vcc through load transistors connected to the bit lines. For example, the bit lines Bj0 and Bj1 are pulled up toward Vcc through the load transistors Q5 and Q6. The column selecting signals, such as Yj, also become low in the power down mode, and the transistors Q7 and Q8 are turned off. Therefore, the data pair DB and $\overline{DB}$ is disconnected from the bit line pairs and is pulled up toward Vcc through the transistors Q9 and Q14. In this case, the potential of one of the data buses DB and $\overline{DB}$ is high and the potential of the other of the data buses DB and $\overline{DB}$ is low in the selected condition before the non-selected condition, according to write-in or read-out data on the data bus pair DB and $\overline{DB}$. Since the size of each of the pull up transistors Q9 and Q14 or Q5 and Q6 becomes very small according to the increase in the degree of integration of the RAM device and the gm of each of these pull up transistors, the pull up speed of the data buses DB and $\overline{DB}$ cannot be high. Therefore, as illustrated in FIG. 2, the potential of the data bus $\overline{DB}$ rises slowly after the time t1 when the chip select signal $\overline{CS}$ changes from low to high. That is, the time period from the time t1 to the time when the potentials of the data bus lines DB and $\overline{DB}$ coincide is long. The length of the time interval between the times t1 and t2 when the chip select signal $\overline{CS}$ is high and the memory chip is in a non-selected condition, varies in a wide range according to various conditions. If the memory chip is selected again a short time after the time when the condition of the memory chip has changed from a selected condition to a non-selected condition, it is possible that an access to the memory device, for example a readout operation, is effected under the condition in which the potentials of the data bus lines DB and $\overline{DB}$ are different from each other, as illustrated in FIG. 2.

If a readout operation is effected under the condition in which the potentials of the data bus lines DB and $\overline{DB}$ are different from each other, it is necessary that the potential of one of the data buses be changed from a medium potential to a high or low potential. For example, in the example of FIG. 2, the potential of the data bus $\overline{DB}$ has to change from a medium potential V1 to a high level. In this case, since the potential of the data bus $\overline{DB}$ rises along an exponential curve, the pull up speed of the data bus $\overline{DB}$ decreases in accordance with the potential rise of the data bus $\overline{DB}$. Therefore, it takes a relatively long time to pull up the data bus $\overline{DB}$ from a medium potential level to a high potential level. Moreover, when readout of information is effected just after the condition of the memory chip has changed from the non-selected condition to the selected condition, the access time becomes long due to the delay of activation of the peripheral circuits, as mentioned before. Therefore, the time period from the time t2 to a time t3, when the potentials of the data buses DB and $\overline{DB}$ cross each other, becomes long. Since a sense amplifier connected to the data buses DB and $\overline{DB}$ detects the potential difference between these data buses and since a readout signal DO is available after the time t3, the access time just after the memory chip has been selected becomes relatively long. It should be noted that the potential V1 of the data bus $\overline{DB}$ at the time t2 varies according to the length of the time period between the times t1 and t2, i.e., the time period when the chip select signal $\overline{CS}$ is high. Therefore, the access time just after the memory chip has been selected varies according to the length of the time period of the non-selected condition. This effect is known as the push out effect.

In order to solve the above-mentioned problems of the conventional static RAM device, the present invention employs the idea of adjusting the potential levels of the data buses DB and $\overline{DB}$ to the same high level by using the chip select signal $\overline{CS}$. In the present invention, when the memory chip has changed from the selected condition to the non-selected condition, electric charges on the data bus lines DB and $\overline{DB}$ are discharged, so that the potentials of the data bus lines DB and $\overline{DB}$ attain a medium level. When the memory chip has changed from the non-selected condition to the selected condition, the data bus lines DB and $\overline{DB}$ are temporarily charged so that the potentials of both the data buses DB and $\overline{DB}$ attain the same high level. After the potentials of the data bus line pair DB and $\overline{DB}$ are pulled up to the same high level, a selected memory cell is connected to the corresponding bit line pair and the bit line pair is connected to the data bus line pair. The potentials of the data bus lines DB and $\overline{DB}$ then change from the above-mentioned high level according to the information stored in the selected memory cell, and readout of information is effected. In this case, since the change of the potentials of the data bus lines DB and $\overline{DB}$ is effected from the same high level and the sense amplifier detects the potential difference between these data buses, the readout operation can be effected at a high speed.

In the circuit of FIG. 1 the MOS transistors Q10 through Q13, connected to the data bus lines DB and $\overline{DB}$, are used to charge and discharge the data bus lines in order to adjust the potentials of these data bus lines to the same high level. These MOS transistors Q10 through Q13 are controlled by a clock signal CLK1 generated at the leading edge of the chip select signal $\overline{CS}$ and a clock signal CLK2 generated at the trailing edge of the chip select signal $\overline{CS}$.

Figure 3:
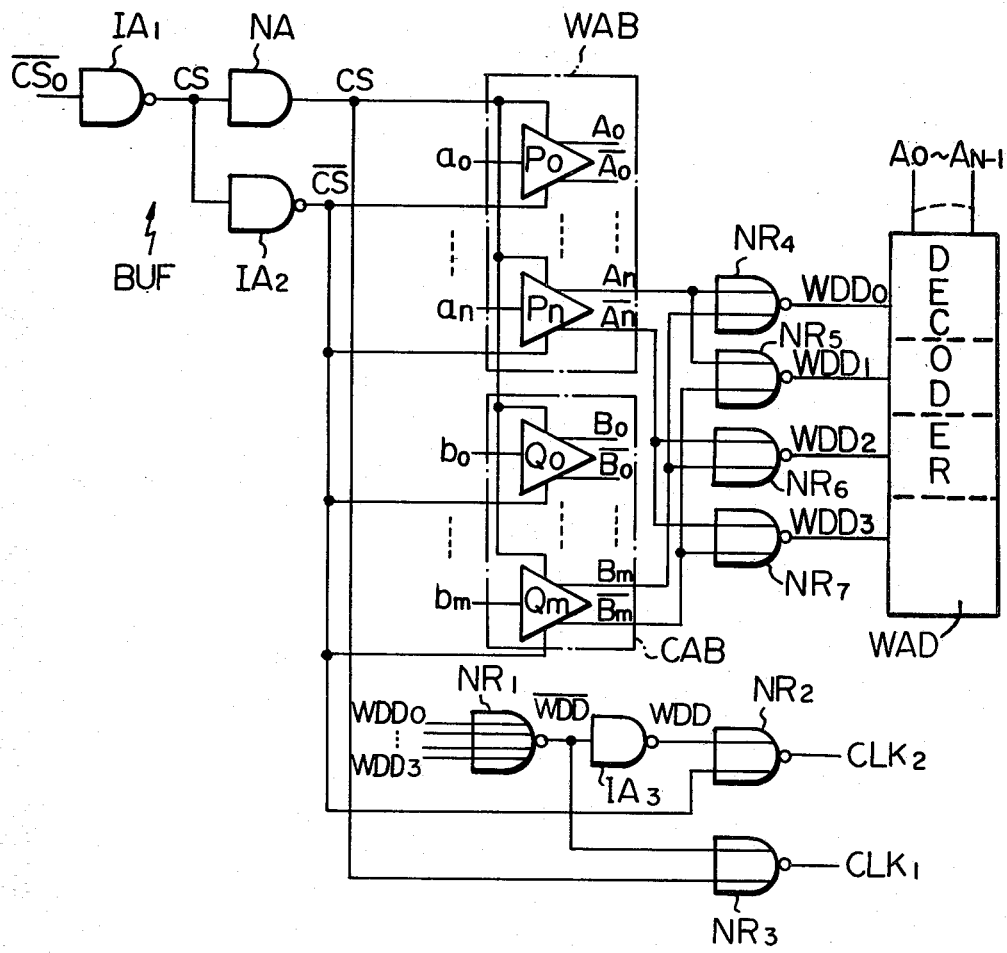
FIG. 3 is a block circuit diagram of a clock generator circuit used in the RAM device of FIG. 1.

Figure 3 illustrates a clock signal generator which generates the clock signals CLK1 and CLK2. The clock signal generator comprises a chip select signal buffer BUF, comprising inverting amplifiers IA1 and IA2 and a non-inverting amplifier NA, NOR gates NR1, NR2, and NR3, and an inverting amplifier IA3. In FIG. 3, WAB is a word address buffer comprising buffer amplifiers P0 through Pn, CAB is a column address buffer comprising buffer amplifiers Q0 through Qm, and NR4 through NR7 are NOR gates. The word address buffer WAB receives input word address signals a0 through an and outputs buffered word address signal pairs A0, $\overline{A0}$ through An, $\overline{An}$ which are supplied to a word address decoder WAD. The column address buffer CAB receives input column address signals b0 through bm and outputs buffered column address signal pairs B0, $\overline{B0}$ through Bm, $\overline{Bm}$ which are supplied to a column address decoder (not shown in FIG. 3). NOR gates NR4 through NR7 operate as word block drivers which output block drive signals WDD0 through WDD3, respectively, each of which is used to activate one of four word decoder blocks of the word decoder WAD in order to reduce power consumption.

Figure 4:
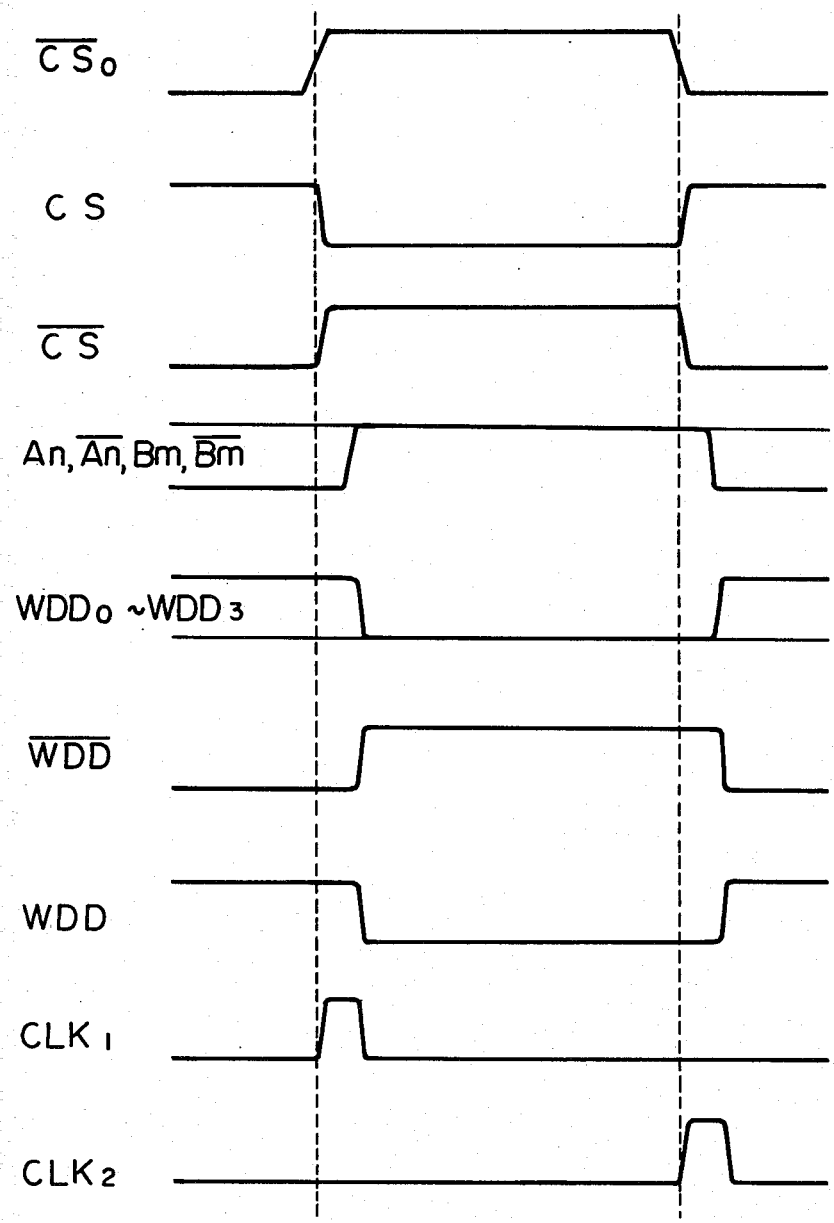
FIG. 4 is a waveform diagram illustrating the operation of the clock generator circuit of FIG. 3.

With reference to FIG. 4, operation of the clock signal generator of FIG. 3 will now be described. In FIGS. 3 and 4, $\overline{CS_0}$ designates an input chip select signal applied from an external circuit to the memory chip. The chip select buffer BUF generates a chip select signal $\overline{CS}$ and an inverted signal CS of the chip select signal ,ovs/CS/. When the memory chip is selected, the input chip select signal $\overline{CS_0}$ and the inverted chip select signal CS are low and high, respectively. Therefore, the buffer amplifiers P0 through Pn of the word address buffer WAB and the buffer amplifiers Q0 through Qm of the column address buffer CAB are activated, and buffered word address signals A0, $\overline{A0}$ through An, $\overline{An}$ and buffered column address signals B0, $\overline{B0}$ through Bm, $\overline{Bm}$, are outputted. Since one of the buffered word address signals An, $\overline{An}$ is low and one of the buffered column address signals Bm, $\overline{Bm}$ is low, one of the block drive signals WDD0 through WDD3 becomes high and one of the word address decoder blocks is activated. The buffered column address signals B0, $\overline{B0}$ through Bm, $\overline{Bm}$ are supplied to a column decoder (not shown in FIG. 3) and a memory cell, corresponding to the input word address signals a0 through an and the input column address signals b0 through bm, is selected. In this case, since one of the block drive signals WDD0 through WDD3 is high and an output signal $\overline{WDD}$ of the NOR gate NR1 is low, both the clock signals CLK1 and CLK2 are low.

When the input chip select signal $\overline{CS_0}$ has changed from low to high, activation of the word address buffer WAB and the column address buffer CAB is stopped with a short delay so that all the buffered word and column address signals become high and all the block drive signals WDD0 through WDD3 become low. Therefore, the output signal $\overline{WDD}$ of the NOR gate NR1 becomes high a short time after the inverted chip select signal CS has changed from high to low. Therefore, the clock signal CLK1 becomes high for a short time after the input chip select signal $\overline{CS_0}$ has changed from low to high When the input chip select signal $\overline{CS_0}$ has changed from high to low, one of the block drive signals WDD0 through WDD3 changes to high with a short delay, and the output signal $\overline{WDD}$ of the NOR gate NR1 becomes low a short time after the chip select signal $\overline{CS}$ has changed from high to low. Therefore, the clock signal CLK2 becomes high for a short time after the input chip select signal $\overline{CS_0}$ has changed from high to low.

Figure 5:
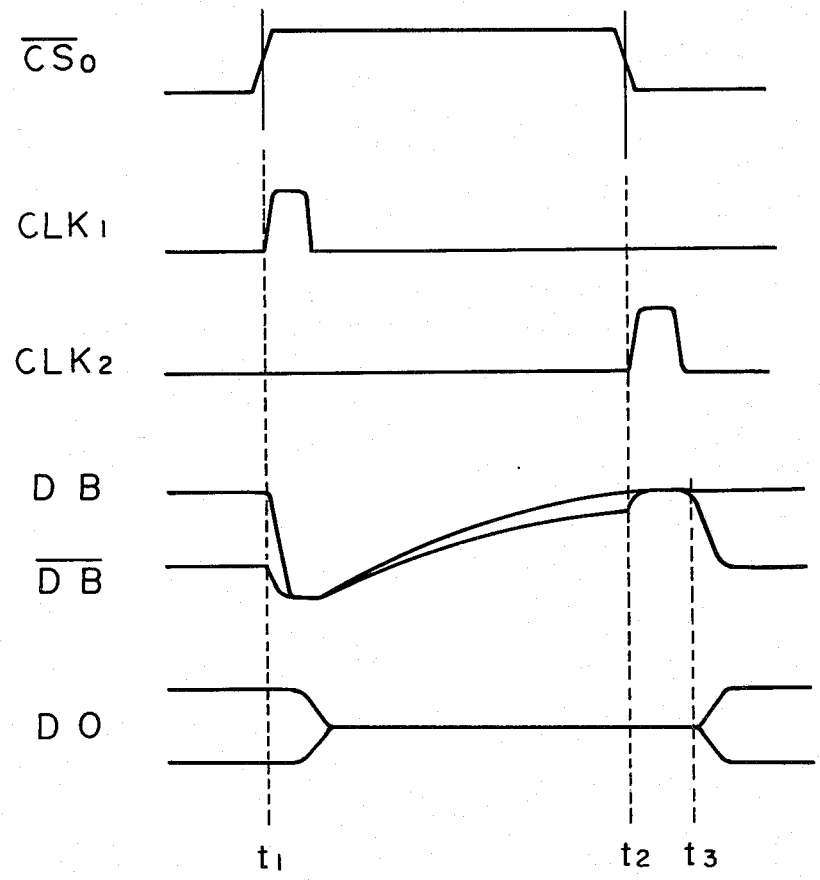
FIG. 5 is a waveform diagram illustrating the operation of the RAM device of FIG. 1.

As illustrated in FIG. 5, when the chip select signal $\overline{CS_0}$ has changed from low to high, the clock signal CLK1 is generated and the transistors Q10 and Q11 of FIG. 1 are turned on for a short time. Therefore, the potentials of the data buses DB and $\overline{DB}$ are pulled down to a medium level which is determined by the internal resistances of the transistors Q10 and Q11 and the transistors Q9 and Q14, so that the electric charges of the data buses DB and $\overline{DB}$ are discharged rapidly to a low voltage Vss, for example, ground. In this way, the potentials of both the data buses DB and $\overline{DB}$ are pulled down to the medium level even when the potential of the data bus Db is high and the potential of the data bus $\overline{DB}$ is low at first. After the clock signal CLK1 becomes low and the transistors Q10 and Q11 are turned off, the data buses DB and $\overline{DB}$ are pulled up gradually toward a high potential level. In this case, since the data buses DB and $\overline{DB}$ are pulled down to the same medium potential level by the clock CLK1, the potentials of the data buses DB and $\overline{DB}$ show nearly equal curves, as illustrated in FIG. 5.

When the chip select signal $\overline{CS_0}$ has changed from high to low and the memory chip is again selected, the clock signal CLK2 is generated and the transistors Q12 and Q13 are turned on for a short time. These transistors Q12 and Q13 pull up the data buses DB and $\overline{DB}$ to a high operating voltage Vcc. If the time period when the chip select signal $\overline{CS}_o$ is high is amply long, the data buses DB and $\overline{DB}$ are already pulled up to the potential Vcc and, therefore, the transistors Q12 and Q13 do not operate effectively. However, if the time period when the chip select signal $\overline{CS}_o$ is high is short, the potentials of the data buses DB and $\overline{DB}$ are at medium levels, and, therefore, the transistors Q12 and Q13 rapidly pull up the data buses Db and $\overline{DB}$ from the medium levels to the potential Vcc. After the clock signal CLK2 changes to low and the transistors Q12 and Q13 are turned off, the peripheral circuits, such as the word decoder and the column decoder, are activated; and the transistors Q3 and Q4 constituting transfer gates and the column selecting transistors Q7 and Q8 of FIG. 1 are turned on so that a usual readout or writein operation is effected.

In the above-mentioned memory device, it is possible to effect a high-speed readout operation. As illustrated in FIG. 5, the potentials of both the data buses DB and $\overline{DB}$ are high a short time after the chip select signal $\overline{CS}_o$ or $\overline{CS}$ has fallen to low. Therefore, the potential of one of the data buses DB and $\overline{DB}$, as determined by the information stored in the memory cell, starts to fall when the memory cell and the data buses DB and $\overline{DB}$ are connected through the bit lines. When the potential of one of the data buses starts to fall, a potential difference is generated between the data buses DB and $\overline{DB}$. The sense amplifier detects this potential difference and outputs readout data DO, as illustrated in FIG. 5. Therefore, the readout data DO is obtained just after the potential of one of the data buses DB and $\overline{DB}$ starts to fall, so that the readout speed can be very fast.

According to the present invention, in a static type semiconductor memory device having a power down mode, the access time just after the memory chip has been selected can be very short. In the memory device according to the present invention, the data buses are pulled up to the same high potential level by the clock signal CLK2 after the data buses are pulled down to the same medium potential level, and therefore it is easy to adjust the potentials of the data buses. Since the clock signals CLK1 and CLK2 are generated for only a short time at the leading and trailing edges of the chip select signal, the power consumption of the memory device is small.

In the above-mentioned memory device according to the present invention, the word decoder is composed of a plurality of word decoder blocks, and each of the word decoder blocks is activated by the block drive signal from each of the word block drivers. In this case, the first and second clock signals are generated by the logical operation between the chip select signal and the block drive signals. However, it is also possible to generate these clock signals by the logical operation between the chip select signal and other internal signals, such as output signals from the chip select signal buffer circuit. It is also possible to adapt the present invention to a static type memory device in which the word decoder is not separated into a plurality of word decoder blocks. In this case, the first and second clock signals are generated by the logical operation between the chip select signal and an internal signal, for example, a power supply voltage to the word decoder, which is generated on the basis of the chip select signal.

I claim:

1. A static type semiconductor memory device including a chip having selected and non-selected conditions comprising:
    bit lines;
    column selecting transistors respectively connected to said bit lines;
    data buses respectively connected to said column selecting transistors;
    a plurality of static type memory cells, each of which is connected to a respective pair of said bit lines, said respective pair of said bit lines connected to a respective pair of said column selecting transistors, said respective pair of said column selecting transistors connected to a respective pair of said data buses;
    first transistors connected to said respective pair of data buses, said first transistors turned on for a first period of time when the chip of said semiconductor memory device is changed from the selected condition to the non-selected condition, said first transistors pulling down the potentials of said respective pair of data buses toward a relatively low first potential; and
    second transistors connected to said respective pair of data buses, and second transistors turned on for a second period of time when the chip of said semiconductor memory device is changed from the non-selected condition to the selected condition, said second transistors pulling up the potentials of said respective pair of data buses toward a relatively high second potential which is greater than said first potential, said static type semiconductor memory device being operated in a power down mode in which all of said plurality of static type memory cells are electrically disconnected from said respective pairs of said bit lines when said chip of said semiconductor memory device is in the non-selected condition.

2. A memory device as set forth in claim 1, wherein said memory device is connected to an operating voltage source having first and second terminals, wherein said first transistors are connected between said respective pair of said data buses and said first terminal of said operating voltage source, and wherein said second transistors are connected between said respective pair of said data buses and said second terminal of said operating voltage source.

3. A memory device as set forth in claim 2, wherein said first terminal of said operating voltage source is a low voltage terminal and wherein said second terminal of said operating voltage source is a high voltage terminal.

4. A memory device as set forth in claim 1, 2 or 3, further comprising:
    means for providing a first clock signal to said first transistors for said first period of time when the chip of said memory device changes from the selected condition to the non-selected condition; and
    means for providing a second clock signal to said second transistors for said second period of time when the chip of said memory device changes from the non-selected condition to the selected condition.

5. A memory device as set forth in claim 4, further comprising means for generating internal signals and peripheral circuits connected to said means for generating internal signals, wherein one of said means for providing a first clock signal and said means for providing a second clock signal comprises means for performing a logical operation between a chip select signal and at least one of the internal signals which are supplied to said peripheral circuits to activate said peripheral circuits and which are generated on the basis of said chip select signal.

6. A memory device as set forth in claim 5, wherein said peripheral circuits comprise a word decoder circuit and wherein said internal signals are a power supply voltage supplied to said word decoder circuit.

7. A memory device as set forth in claim 5, wherein said memory device further comprises:
   a plurality of word decoder blocks forming a word decoder; and
   a plurality of word block drivers, each connected to and activating one of said word decoder blocks, wherein said internal signals comprise block drive signals generated by said word block drivers to activate said word decoder blocks.

8. A memory device as set forth in claim 4, wherein said memory device is a random access memory device comprising a plurality of flip-flop type memory cells.

9. A memory device as set forth in claim 5, wherein said memory device is a random access memory device comprising a plurality of flip-flop type memory cells.

10. A memory device as set forth in claim 6, wherein said memory device is a random access memory device comprising a plurality of flip-flop type memory cells.

11. A memory device as set forth in claim 7, wherein said memory device is a random access memory device comprising a plurality of flip-flop type memory cells.

* * * * *

UNITED STATES PATENT AND TRADEMARK OFFICE
CERTIFICATE OF CORRECTION

PATENT NO. : 4,455,627
DATED : JUNE 19, 1984
INVENTOR(S) : ATSUSHI ORITANI

It is certified that error appears in the above-identified patent and that said Letters Patent is hereby corrected as shown below:

Col. 2, line 43, "is" should be --is a--.

Col. 3, line 14, "$1_1$ and $_2$" should be --$\ell_1$ and $\ell_2$--.

Col. 5, line 68, ",ovs/CS/ ." should be --$\overline{CS}$.--.

Col. 6, line 54, "Db" should be --DB--.

Col. 7, line 8, "Db" should be --DB--;
line 15, "writein" should be --write-in--.

Signed and Sealed this

Second Day of October 1984

[SEAL]

Attest:

GERALD J. MOSSINGHOFF

Attesting Officer    Commissioner of Patents and Trademarks